United States Patent [19]
Cappelletti

[11] Patent Number: 5,913,120
[45] Date of Patent: *Jun. 15, 1999

[54] PROCESS FOR FABRICATING INTEGRATED DEVICES INCLUDING NONVOLATILE MEMORIES AND TRANSISTORS WITH TUNNEL OXIDE PROTECTION

[75] Inventor: Paolo Giuseppe Cappelletti, Seveso, Italy

[73] Assignee: SGS-Thomson Microelectronics S.r.l., Agrate Brianza, Italy

[*] Notice: This patent is subject to a terminal disclaimer.

[21] Appl. No.: 08/502,329

[22] Filed: Jul. 13, 1995

Related U.S. Application Data

[63] Continuation of application No. 08/196,634, Feb. 15, 1994, Pat. No. 5,466,622.

[30] Foreign Application Priority Data

Feb. 17, 1993 [EP] European Pat. Off. .............. 93830057

[51] Int. Cl.[6] .................................................. H01L 21/336
[52] U.S. Cl. .......................... 438/257; 438/264; 438/979; 438/237; 438/564
[58] Field of Search ...................... 437/52, 904; 438/257, 438/264, 979, 237, 564

[56] References Cited

U.S. PATENT DOCUMENTS

| | | | |
|---|---|---|---|
| 4,635,347 | 1/1987 | Liem et al. ................................ | 437/43 |
| 4,719,184 | 1/1988 | Cantarelli et al. . | |
| 4,775,642 | 10/1988 | Chang et al. ............................... | 437/43 |
| 5,036,018 | 7/1991 | Mazzali ...................................... | 437/43 |
| 5,183,773 | 2/1993 | Miyata ....................................... | 437/43 |
| 5,466,622 | 11/1995 | Cappelletti ................................ | 437/52 |

OTHER PUBLICATIONS

IBM Technical Disclosure Bulletin, vol. 29, No. 4., Sep. 1986, New York, USA, "Electrostatic Discharge Immune Storage Plate Structure For One–Device Cells".

Primary Examiner—John F. Niebling
Assistant Examiner—Lynne A. Gurley
Attorney, Agent, or Firm—Wolf, Greenfield & Sacks, P.C.

[57] ABSTRACT

A process for simultaneously fabricating memory cells, transistors, and diodes for protecting the tunnel oxide layer of the cells, using the DPCC process wherein the first polysilicon layer is not removed from the transistor area, and the gate regions of the transistors are formed by shorted first and second polysilicon layers. To form the diodes, the poly1 layer is removed from the active areas in which the diodes are to be formed, using the same mask employed for shaping poly1; the interpoly dielectric layer and the gate oxide layer are removed from the active areas of the diodes, using the same mask employed for removing the dielectric layer from the transistor area; a second polysilicon layer is deposited directly on to the active areas of the diodes; and the poly2 doping ions penetrate the active areas to form N+ regions which, together with the substrate, constitute the protection diodes. The diodes are thus formed prior to shaping poly2, and are connected to the control gates of the cells by the second polycrystalline silicon layer strips forming the word lines.

9 Claims, 5 Drawing Sheets

PROCESS FOR FABRICATING INTEGRATED DEVICES INCLUDING NONVOLATILE MEMORIES AND TRANSISTORS WITH TUNNEL OXIDE PROTECTION

This application is a continuation of application Ser. No. 08/196,634, filed Feb. 15, 1994, entitled PROCESS FOR FABRICATING INTEGRATED DEVICES WITH TUNNEL OXIDE PROTECTION now U.S. Pat. No. 5,466,622.

BACKGROUND OF THE INVENTION

1. Field of the Invention

The present invention relates to a process for fabricating integrated devices including nonvolatile memories and transistors with tunnel oxide protection.

Though applicable to EPROM, EEPROM and flash-EEPROM memories, the present invention is particularly advantageous in the case of flash-EEPROMs to which special reference is made in the following description.

2. Discussion of the Related Art

Flash-EEPROM memories are Electrically Era-sable Programmable Read Only Memories (EEPROMS), which combine the high density and low cost of EPROMs with the advantage of electrical erasability. They have recently become the most attractive of nonvolatile memories for their potential application in solid state disks for portable computers.

Though various flash memory concepts have been developed, most manufacturers employ double-poly single-transistor cells with a structure closely resembling that of standard EPROM cells. Flash-EEPROM memory cells comprise an NMOS transistor with a polysilicon floating gate region capacitively coupled to a polysilicon or polycide (polysilicon and silicide) control gate region. The main difference between EEPROM and flash-EEPROM memories lies in the thickness of the oxide between the floating gate region and the substrate which is thinner in the case of flash cells.

The yield and reliability of flash memories are known to be closely related to the quality of the tunnel oxide, which quality not only depends on preoxidation cleaning and the oxidation process itself, but is also strongly affected by the post-oxidation process steps.

Of all the process steps, the most critical are those which expose the wafer to radiation damage, namely ion implantation, plasma etching, sputtering and plasma enhanced chemical vapour deposition.

Currently used flash-EEPROM memory processes present a large number of such steps following growth of the tunnel oxide.

The model generally accepted for explaining in-process radiation is the so-called "antenna effect" in which charges are trapped in conductive layers and may result in a critical increase in the potential of the layers.

To explain the phenomenon, it should be borne in mind that ion implantation and plasma processes involve the collision of charged particles (either electrons or ions) with the wafer surface, so that conductive polysilicon layers insulated from the silicon substrate may be charged by capturing the charged particles.

If the polysilicon layer is not patterned, it acts as an electrostatic shield. In fact, the charge is distributed evenly over the entire area of the wafer, thus generating a low electric field. This is also because, in the case of ion implantation, the beam is localized and the overall charge density is low. In addition, the metal grips holding the wafer may act as discharge lines for at least partly removing the captured charged particles, so that little danger exists for the dielectric layer underlying the polysilicon.

If, on the other hand, the layer is patterned and comprises "islands", i.e., areas insulated conductively from the rest of the layer and separated from the substrate by a thin oxide layer, as in the case of gate regions, the layer is charged to a potential that depends on the collecting area and its capacity versus the substrate, i.e., the area of the thin oxide. If the ratio between the collecting area and the area of the thin oxide is unfavourable (high), the gate region may easily reach a potential higher than the breakdown voltage of the thin oxide, thus resulting in oxide breakdown—in turn, resulting in "zero time" device failure, i.e. before it is even used—or in oxide damage with the formation of traps in the oxide itself and which, in turn, results in "latent" device failure and impaired reliability. The above model also applies to flash cells. In fact, in certain situations, the tunnel oxide may be damaged due to capacitive coupling of the control and floating gate regions, and the lower dielectric resistance of the tunnel oxide in relation to the dielectric layer separating the control and floating gates. The likelihood of this occurring is even greater, in view of the extensive collecting area defined by the polysilicon strips forming the control gates, and the small area of the tunnel oxide of each cell. Consequently, the tunnel oxide may be broken or damaged in the event the control gate region is charged to a potential greater than the breakdown voltage of the tunnel oxide divided by the coupling factor of the control gate.

It is an object of the present invention to provide a process for fabricating integrated devices with protection of the thin tunnel oxide layer of the memory cells, and which provides for exploiting the basic principle and technical advantages of the DPCC process, described below.

SUMMARY OF THE INVENTION

According to the present invention, there is provided a process for fabricating integrated devices, including nonvolatile memories and transistors.

This process particularly relates to fabricating processes such as the DPCC process, in which memory cells and circuit transistors are formed on a substrate. A significant portion of this process includes the following step: growing field oxide regions on portions of the substrate; forming a gate oxide layer on the surface in an area in which the transistors will be formed; forming a thin tunnel oxide layer on the surface in an area in which the memory cells will be formed; depositing a first polycrystalline silicon layer; selectively removing portions of the first poly layer at the sides of the memory cells; depositing a dielectric layer; removing the dielectric layer from the area in which transistors will be formed; depositing a second polycrystalline silicon layer; masking and selectively removing the second poly layer and an underlying dielectric layer at the sides of the memory cell and the second and first poly layers and the gate oxide layer at the sides of the transistors so as to shape the control gate regions of the memory cells and the gate regions of the transistors; then, using a same mask, selectively removing the first poly layer and the thin oxide layer at the sides of the memory cells so as to shape the floating gate regions; and, prior to removing the second poly layer and dielectric layer, forming protection diodes, connecting the second poly layer to the substrate.

BRIEF DESCRIPTION OF THE DRAWING

A preferred non-limiting embodiment of the present invention will be described by way of example with reference to the accompanying drawings, in which.

DETAILED DESCRIPTION

To solve the "antenna effect" problem, a U.S. patent application entitled "Nonvolatile EPROM, EEPROM or flash-EEPROM memory with tunnel oxide protection", filed concurrently by the present Applicant and the content of which is incorporated herein by reference, proposes the formation of diodes between the control gate regions of the memory cells and the substrate. These diodes are turned on when the potential of the control gate, due to the antenna effect, reaches a critical level greater than the operating potential (during programming) but below the potential capable of damaging or breaking the thin oxide layer.

Figure 1:
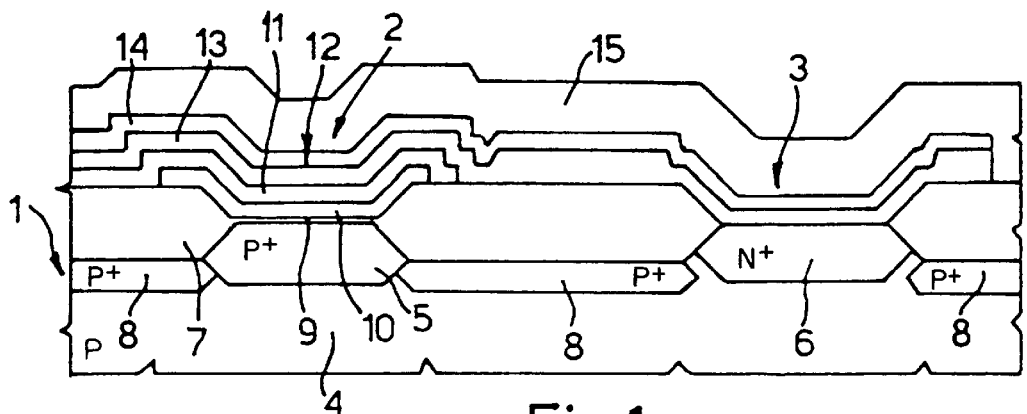
FIG. 1 shows a cross section of a portion of a device integrating a flash-EEPROM memory cell and protection diode.

By way of explanation, FIG. 1 shows a cross section of a portion of a silicon wafer 1 in which are formed a memory cell 2 and a protection diode 3. FIG. 1 shows, embedded in a P type substrate 4, a P+ type channel region 5 and an N+ type cathode region 6; thick field oxide regions 7 separating the various components; enriched insulating regions 8 extending beneath field oxide regions 7 and defining channel stoppers; and, over channel region 5, a thin tunnel oxide layer 9, a flouting gate region 10, an interpoly dielectric layer 11, a control gate region 12 (formed by a polysilicon layer 13 and silicide layer 14, in turn forming a polycide layer), and a protective passivating oxide layer 15. As shown in FIG. 1, the first polysilicon layer 10 is only provided at memory cell 2, while the second polysilicon layer 13 extends as far as the diode 3 area and is in direct electrical contact with cathode region 6. Cathode region 6 forms a PN junction with substrate 4 and so forms diode 3. As cells 2 of the memory array are arranged in lines and columns, and all the cells on the same line present control gate regions formed by a respective polycide strip 13, 14, only one diode 3 is provided for each polycide strip, and is located on the periphery of wafer 1, at the end of the respective polycide strip.

A further European patent application, filed on Nov. 2, 1993 by the present Applicant and entitled "Process for fabricating integrated devices including flash-EEPROM memories and transistors", describes a flash-EEPROM process affording advantages in terms of reliability and the number of masks required. According to this process, known as DPCC (Shorted Double Poly), the first and second polysilicon layers, which are separated electrically in the memory cell area and define the floating gate and control gate regions respectively, are shortcircuited in the control circuit transistor area for forming the gate regions of the transistors (so that, unlike other known processes, the DPCC process does not require removal of the first polysilicon layer in the circuit area). For EPROM memories, a similar process is protected by USA Patent U.S. Pat. No. 4,719,184 issued on Dec. 1, 1988.

The concurrent application entitled "Nonvolatile EPROM, EEPROM or flash-EEPROM memory with tunnel oxide protection" relates to a process for forming protection diodes. That method, however, involves a special masking step, thus increasing the production cost of the device.

With reference to FIGS. 2–9, a description will first be given of the DPCC process according to the European patent application No. 93830050.6 filed on Nov. 2, 1993 by the present Applicant and entitled "Process for fabricating integrated devices including flash-EEPROM memories and transistors."

Figure 2:
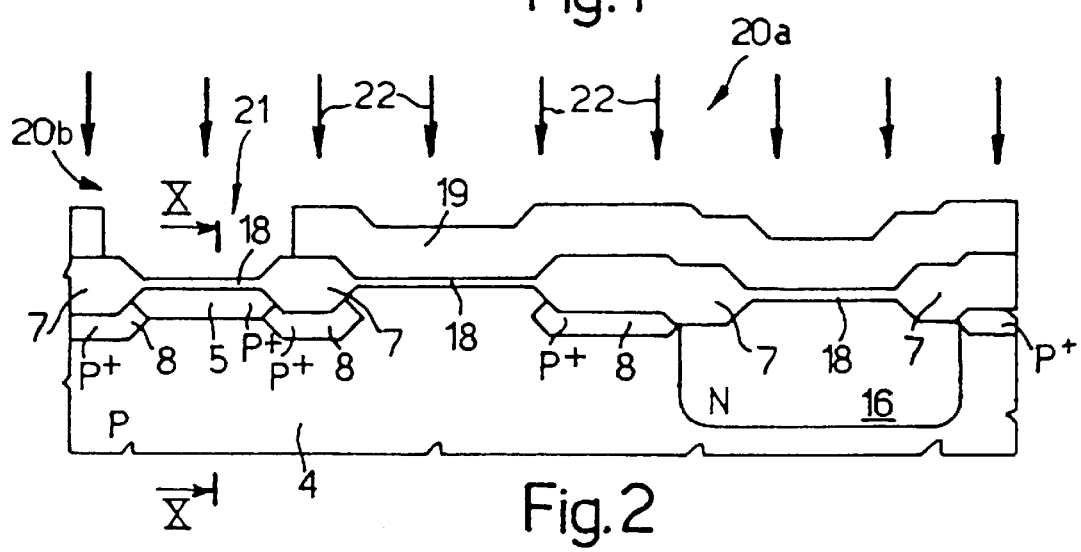
FIGS. 2 to 9 show cross sections, perpendicular to the FIG. 1 section, of a silicon wafer at various steps in the DPCC process for fabricating an integrated device including a flash-EEPROM memory and transistors.

FIG. 2 shows in intermediate structure produced by forming, in P type substrate 4, N type wells 16 and enriched isolation regions or channel stoppers 8 superimposed with field oxide regions 7. Over substrate 4, a gate oxide layer 18 is formed covering the active regions (in which the circuit transistors and memory array cell are to be formed). Elsewhere layer 18 merges with field oxide layer 7. All the above layers and regions are formed as in the standard process.

An EPROM cell implant mask (so-called EPM mask) is then formed for implanting boron ions into the channel area of memory cell 2, to prevent punch-through of the substrate in the presence of high electric fields, and to enhance programming efficiency.

This step is shown in FIG. 2, which shows the EPM mask 19 covering the entire circuit portion (to the right in FIGS. 2–9 and indicated by 20a) and which presents a window 21 over the area in which the cells are to be formed (to the left in the drawings and indicated 20b). FIG. 2 also shows, symbolically by means of arrows 22, boron implantation which is used to form P+ type channel region 5 in the active region of the cell.

Figure 3:
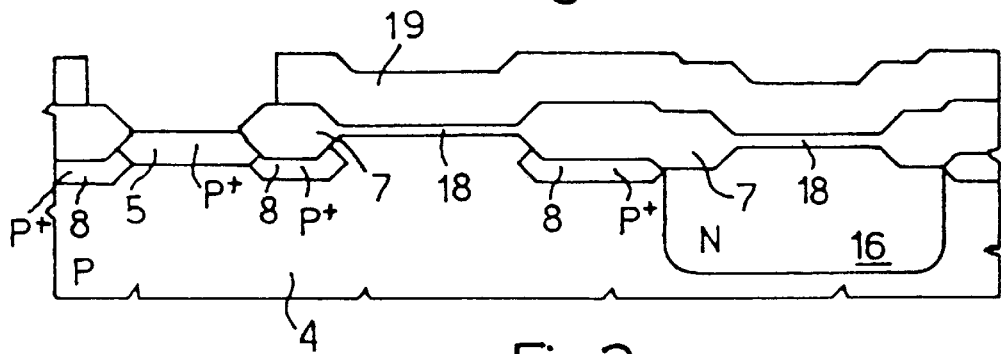

Using the same EPM cell implant mask 19, gate oxide layer 18 is chemically etched and removed from the cell area to give the intermediate structure in FIG. 3. The EPM mask 19 is then removed and the wafer cleaned.

Figure 4:
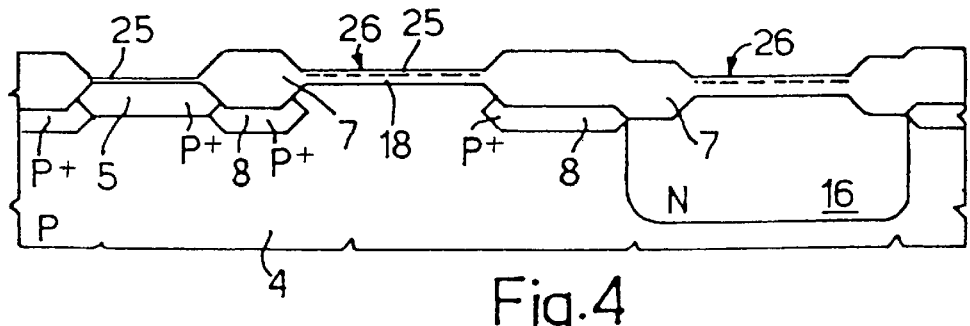

The wafer is then oxidized to grow a thin oxide layer 25 directly on the surface of the substrate in the cell area, the oxidation parameters being so selected as to obtain the required characteristics of the thin tunnel oxide layer, especially as regards thickness. oxidation also results in a slight increase in thickness of the gate oxide of the circuit transistors, as shown (exaggeratedly for the sake of clarity) by the dotted line in FIG. 4, indicating the original thickness of layer 18. The resulting total oxide layer over the circuit area is indicated by 26.

Figure 5:
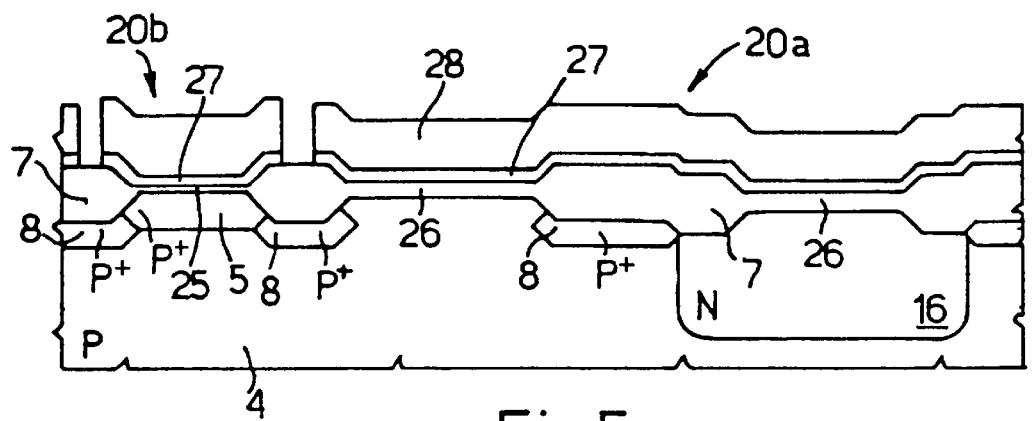

A first polycrystalline silicon layer 27 (poly1) is then deposited, doped with PoCl 3 or by ion implantation, and shaped using a resist mask 28 (FIG. 5) covering the whole of the circuit area and enabling chemical etching and removal of the exposed portions of poly1 at the sides of memory area 20b, as shown in FIG. 5.

Figure 6:
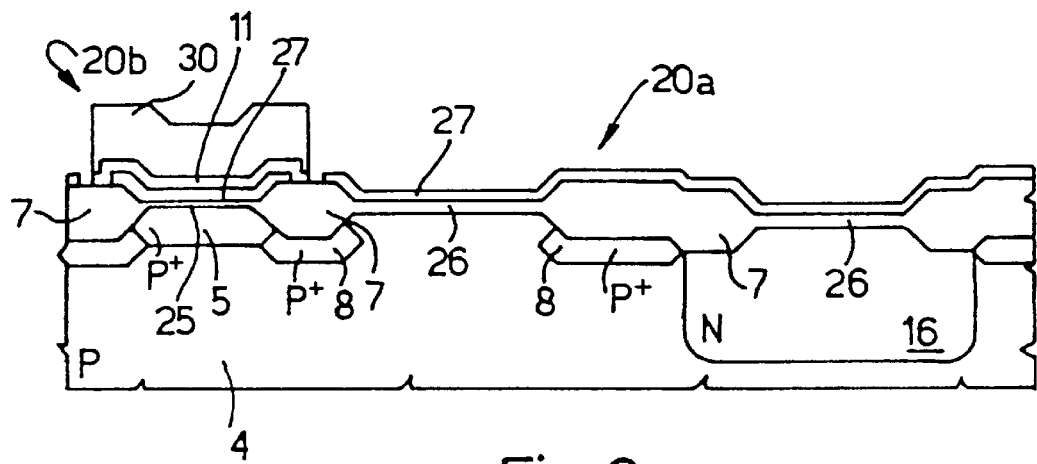
Figure 7:
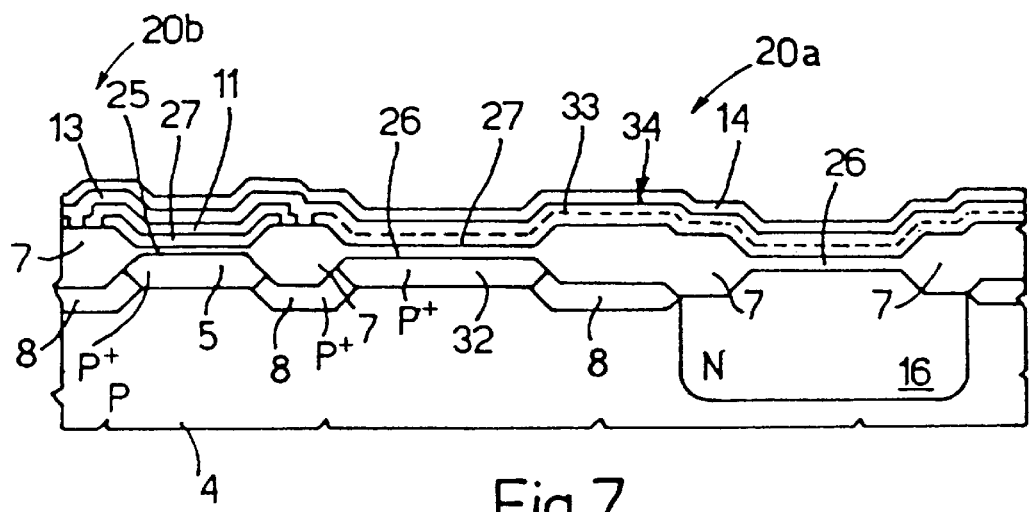

A dielectric (so-called "interpoly" dielectric) layer 11 is then grown, consisting, in this case, of a triple ONO (thermal oxide/CVD nitride/thermal oxide) layer, but which may also consist of a single oxide layer as shown in FIG. 6 onwards. Dielectric layer 11 is then shaped using a mask (array mask) 30 covering cell array area 20b and leaving circuit area 20a exposed, to give the intermediate structure shown in FIG. 6. Before removing mask 30, boron ions are implanted to adjust the threshold of the N channel circuit transistors and form a P+ enriched region 32 (FIG. 7). This step also reduces the surface doping concentration in the active regions of the P channel transistors (in N well 16) to adjust the threshold to the required value.

Following removal of mask 30, the second polycrystalline silicon layer 13 (poly2) is deposited. As shown in FIG. 7, in circuit area 20a, poly2 13 is deposited directly on to poly1 27 with which it merges to form a single polysilicon layer 34 (separated by the dotted line into two layers in the drawings for the sake of clarity). In the memory array area, however, it is separated from poly1 27 by dielectric layer 11. Poly2 13 is then doped with POCl$_3$, and a silicide layer 14, e.g. tungsten silicide WSi$_2$, is chemically vapour deposited to give the intermediate structure shown in FIG. 7.

Figure 8:
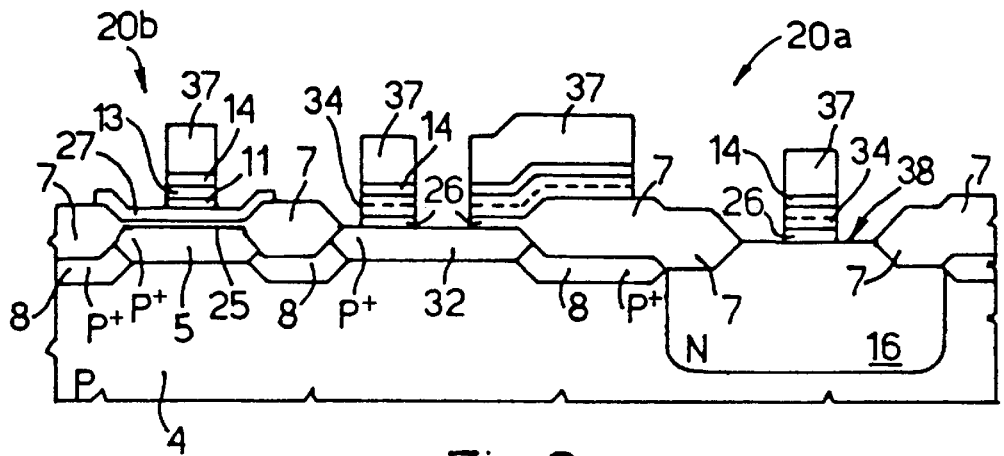
Figure 9:
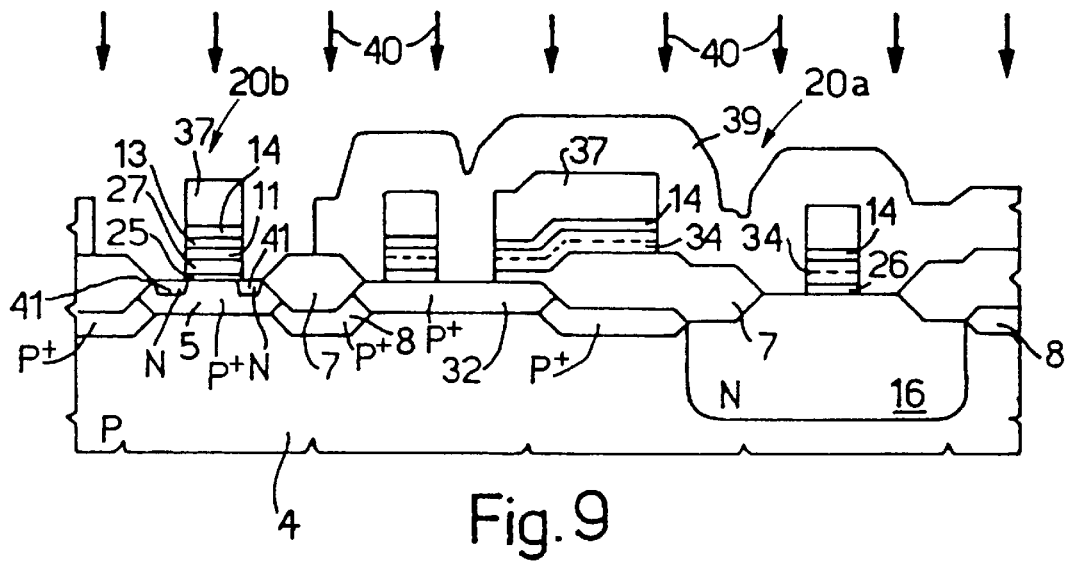

A mask 37 (poly2 mask, FIG. 8) is then formed for shaping the circuit transistor gate regions and the control gate regions of the array cells; and the exposed portions of the polysilicon layer (13 for the memory cells and 34 for the transistors) and the dielectric layer 11 for the cells and oxide layer 26 for the transistors are chemically etched down to poly1 27 in cell area 20b, and down to larger surface 38 of the substrate in circuit transistor area 20a, to give the intermediate structure shown in FIG. 8.

A further mask (transistor protection mask 39, FIG. 9) is deposited over poly2 mask 37 so as to cover only circuit area 20a; and the portions of poly1 left exposed by mask 37 or 39 are chemically etched (to self-align the floating gate and control gate regions). Before removing masks 37 and 39, arsenic is implanted, as shown by arrows 40 in FIG. 9, so as to form N type drain and source regions 41 in the active area of the memory array cells and which are self-aligned with the floating and control gate regions, as shown by the intermediate structure in FIG. 9.

The rest of the process follows the standard CMOS flow, for forming the circuit transistor source and drain regions, the component protection layers and the connections.

One embodiment of the process according to the present invention will be described with reference to FIGS. 10–16, and for producing a flash-EEPROM cell and protection diode 3. The process according to the present invention involves only minor alterations to the standard process flow. The intermediate structures, in the perspective of FIG. 2–9, however, are identical to those already described. In the following description, therefore, FIGS. 10–16 show cross sections of the intermediate structures along line X—X in FIGS. 2–8. For the sake of simplicity, any parts common to FIGS. 2–8 and 10–16 are indicated using the same numbering system; and, for each intermediate structure in FIGS. 10–16, the corresponding structure produced by sectioning wafer 1 as shown in FIGS. 2–9 are indicated.

Figure 10:
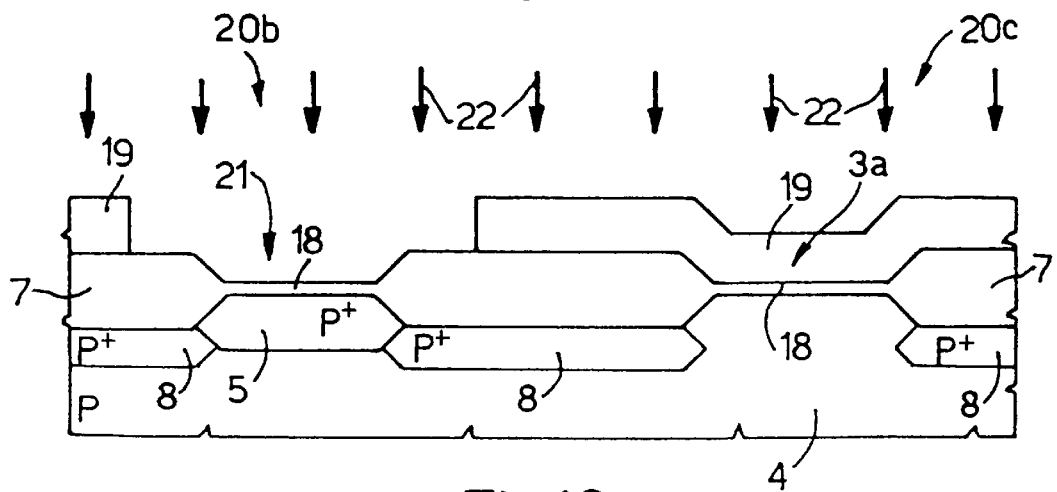
FIGS. 10 to 16 show cross sections, as in FIG. 1, of various steps in the fabrication of the FIG. 1 structure according to the present invention.

The initial steps of the process according to the present invention are already described and produce the intermediate structure shown in FIG. 10, which corresponds exactly with that of FIG. 2 and is obtained at the same time.

FIG. 10 therefore shows a P type substrate 4; field insulating regions 7; enriched insulating regions 8; and oxide layer 18. Field insulating regions 7 and enriched regions 8 laterally define an active area 3a in which to form a diode 3, so that the relative masks must be shaped accordingly. FIG. 10 also presents the EPM mask 19 having a window 21 over the cell area 20b, and covering the area 20c in which the diodes are to be formed. The cell implant (arrows 22) for forming P+ type channel region 5 is performed using EPM mask 19, so as to shield the diode area from the implant, which would otherwise result in too low a breakdown voltage of the diodes.

Figure 11:
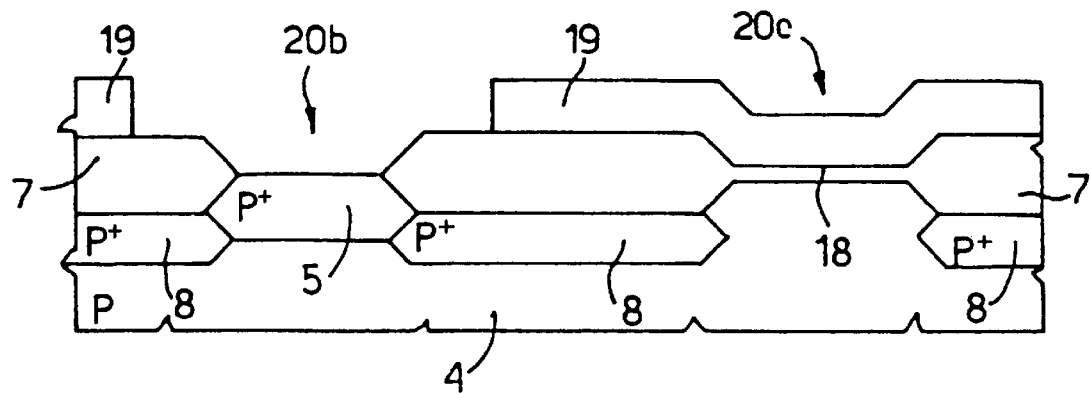
Figure 12:
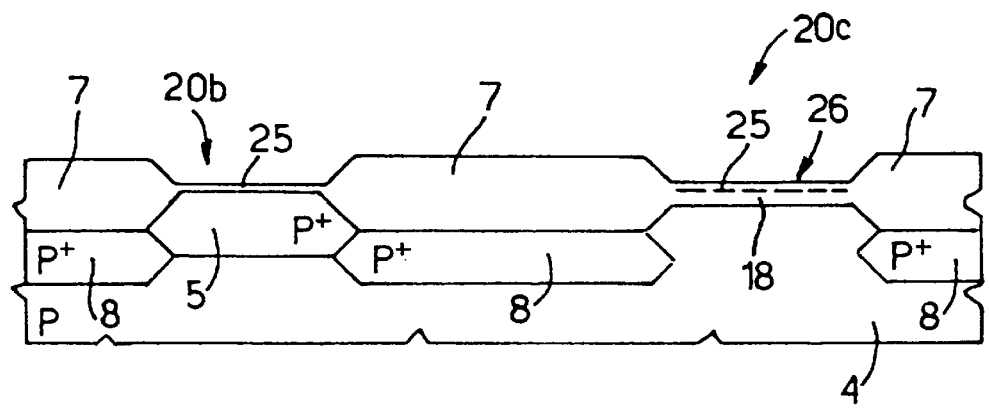

Gate oxide layer 18 (shielded by mask 19) is then etched to give the intermediate structure shown in FIG. 11, wherein oxide 18 is removed solely from cell area 20b and is left in diode area 20c. The FIG. 11 structure corresponds with that of FIG. 3.

EPM mask 19 is then removed; the wafer is cleaned; and thin oxide layer 25 is grown as described previously. The thickness of the oxide over diode area 20c is also increased slightly, as shown by the dotted line, so that the active areas 3a of diode area 20c present a total oxide layer 26 to give the structure shown in FIG. 12, which corresponds with that of FIG. 4.

Figure 13:
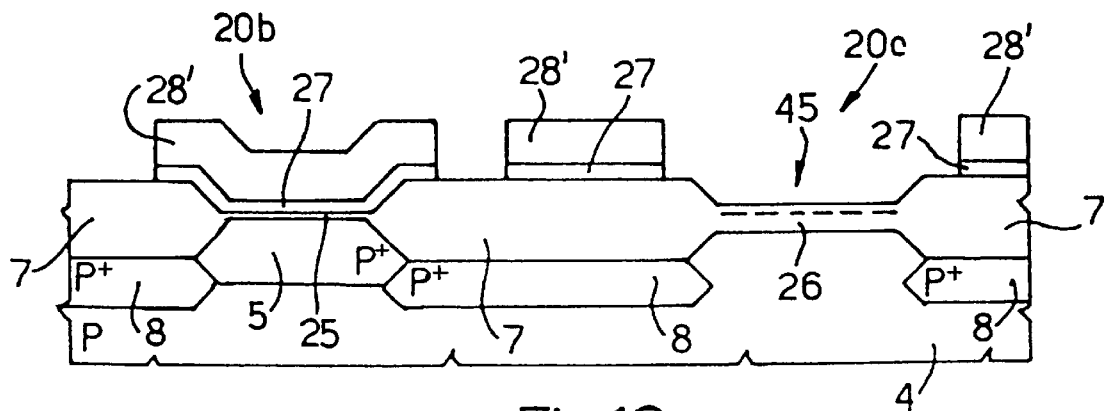
Figure 14:
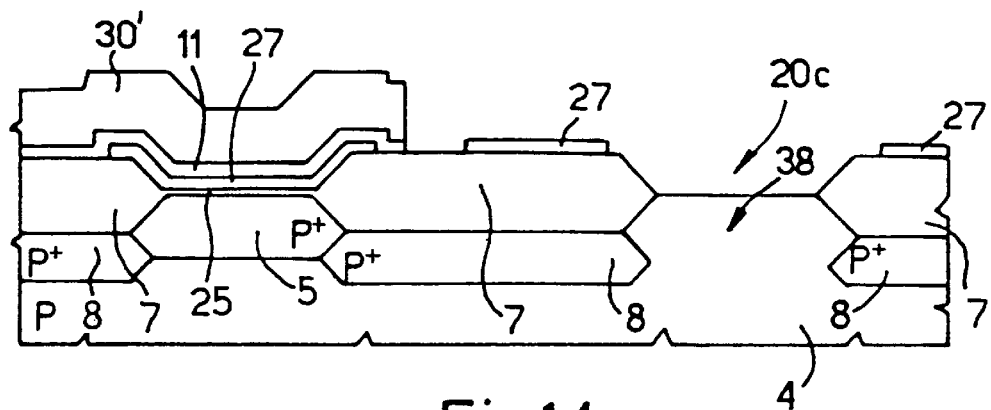

The first polycrystalline silicon layer (poly1) 27 is then deposited, doped with POCl 3 or by ion implantation, and then shaped. For this purpose, a resist mask 28' is used, which, for the transistor and cell areas, is identical to mask 28, but which, in diode area 20c, presents a number of windows 45, one for each diode to be formed, as shown in FIG. 13. Subsequent chemical etching thus provides for removing the exposed portions of poly1 not only at the sides of memory area 20b but also from the active areas 3a of diode area 20c, to give the intermediate structure shown in FIG. 13, which corresponds with that of FIG. 5.

Interpoly dielectric layer 11, which, in this case also, may consist of a triple ONO layer but is shown as a single layer, is then grown and shaped using an array mask 30' identical to mask 30 in FIG. 6 except that it leaves diode area 20c exposed. Chemical etching of the exposed oxide layer thus results in removal of the dielectric 11 and gate oxide 26 portions over active areas 3a of diode area 20c, and removal of the dielectric 11 portions over transistor area 20a, to give the intermediate structure shown in FIG. 14, which corresponds with that of FIG. 6.

Figure 15:
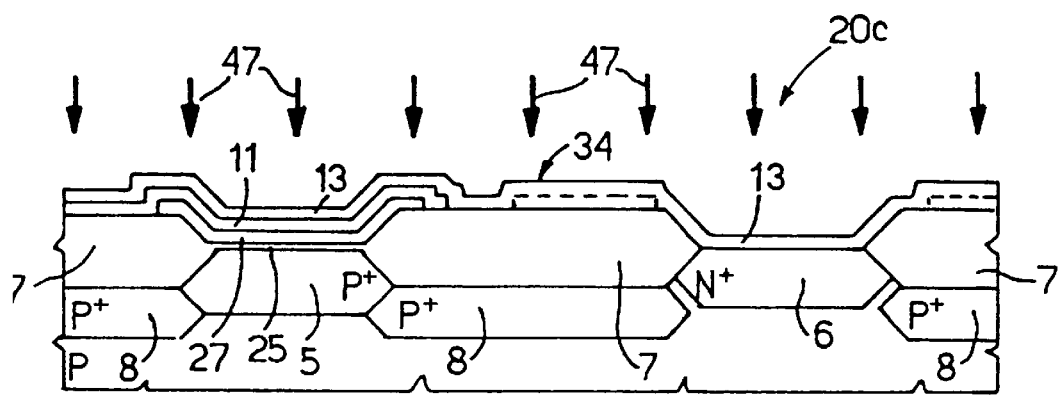

Boron ions are then implanted to adjust the threshold of the N channel circuit transistors, as described with reference to FIG. 7; mask 30' is removed; and the second polycrystalline silicon layer 13 (poly2) is deposited. As shown in FIG. 15, in region 20c of diode active areas 3a, poly2 13 is deposited directly on the surface of substrate 4, while, as described with reference to FIG. 7, in cell area 20b, it is separated from poly1 27 by dielectric layer 11, and, in circuit area 20a, is deposited directly on poly1 27 to form layer 34 (as shown partly also in FIG. 15). Poly2 13 is then doped with POCl 3 as shown by arrows 47 in FIG. 15. Because active areas 3a of diode area 20c are not shielded by the gate oxide (as in transistor area 20a), part of the doping ions penetrates inside substrate 4 and accumulates close to the larger surface in area 38, thus forming cathode regions 6 of the diodes, as shown for one diode in FIG. 15. No equivalent of the intermediate structure in FIG. 15 is shown in FIGS. 2–9.

Figure 16:
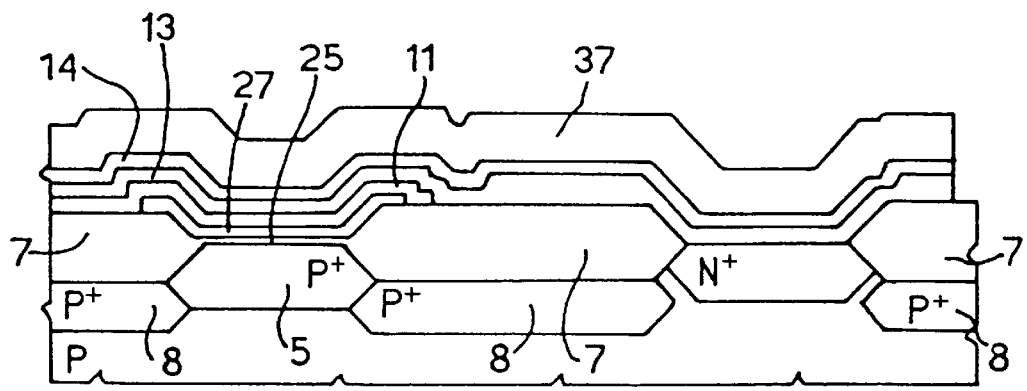

Silicide layer 14, e.g., tungsten silicide WSi 2f is then chemically vapour deposited; and poly2 mask 37 is deposited for shaping the gate regions of the circuit transistors and the control gate regions of the array cells, as described with reference to FIG. 8, to give the intermediate structure shown in FIG. 16, which corresponds with that of FIG. 8. Note that mask 37 covers the whole of diode area 20c, which is thus unaffected by subsequent etching.

The next steps are as already described and comprise the following: forming transistor protection mask 39, which, in diode area 20c, may or may not be formed over mask 37; self-aligned chemical etching of the floating gate regions; arsenic implantation for forming the drain and source regions of the cells; forming the source and drain regions of the circuit transistors; and forming the component protection layers and connections.

As indicated in concurrent patent application entitled "Nonvolatile EPROM, EEPROM or flash-EEPROM memory with tunnel oxide protection," the diodes prevent the control gate region of each cell from reaching a potential that may damage the tunnel oxide. Before such a potential is reached, in fact, the diodes become conductive and discharge the excess charges, which would otherwise result in an increase in potential in relation to the substrate, thus maintaining a safe maximum potential of the control gate regions. By virtue of being formed prior to shaping the polysilicon layer forming control gate regions 12 together with the silicide, the diodes become operative prior to the critical steps in the process which could result in an increase in potential of the polysilicon layer.

In the case of the process described herein, the diodes protecting the tunnel oxide of flash-EEPROM cells are formed using the known DPCC process, which is modified only as regards the shape of the masks. As such, the present process provides for fully exploiting the advantages of the DPCC process, in particular, experience and know-how of the process, for producing memories of known, reliable electrical characteristics.

Furthermore, the specific solution described herein provides for producing the protection diodes with no need for specific masking steps, and therefore substantially at the same cost as flash-EEPROM memories.

To those skilled in the art it will be clear that changes may be made to the process as described and illustrated herein without, however, departing from the scope of the present invention. In particular, the process described is independent of the type of dielectric employed (ONO or single oxide layer) or the material of the control gate region (polysilicon or polycide, i.e. polysilicon and silicide).

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A method for manufacturing a protection diode in an integrated memory device, wherein the integrated memory device includes a substrate, a first polysilicon layer disposed over at least a portion of the substrate, and a second polysilicon layer, comprising the steps of:

forming the second polysilicon layer over a gate area and directly on the substrate in a diode area;

doping the second polysilicon layer in the diode area, so that doping ions penetrate into the substrate in the diode area to form the protection diode; and masking the second polysilicon layer over a region between the diode area and the gate area and etching the second polysilicon layer, so that the protection diode is coupled between the substrate and the gate area.

2. The method of claim 1, further including the steps of:

removing the first polysilicon layer from the diode area prior to forming the second polysilicon layer; and removing a gate oxide layer from the diode area prior to forming the second polysilicon layer.

3. The method of claim 2, further comprising the steps of:

placing a single mask over a transistor location and the diode area; and shaping the second polysilicon layer by etching locations not covered by the single mask.

4. A method for manufacturing an integrated memory device, wherein the integrated device includes a first polysilicon layer, a second polysilicon layer, a tunnel oxide, and a substrate, the method comprising the steps of:

forming a diode between the substrate and the second polysilicon layer by doping the second polysilicon layer so that doping ions penetrate into the substrate to form the diode; and forming a control gate region of a memory cell subsequent to the step of forming the diode so that the diode prevents the control gate region of the memory cell from reaching a potential that may damage the tunnel oxide.

5. The method of claim 4, wherein the step of forming the diode is performed prior to formation of a transistor protection mask.

6. The method of claim 4, wherein the step of forming the diode is performed prior to chemical etching of floating gate regions.

7. The method of claim 4, wherein the step of forming the diode is performed prior to arsenic implantation, the arsenic implantation being performed to form drain and source regions of cells.

8. The method of claim 4, wherein the step of forming the diode is performed prior to formation of source and drain regions of circuit transistors.

9. The method of claim 4, wherein the step of forming the diode is performed prior to formation of component protection layers and connections.

* * * * *